(12) United States Patent
Blaum et al.

(10) Patent No.: US 6,288,861 B1
(45) Date of Patent: Sep. 11, 2001

(54) DISK DRIVE WITH SECTOR NUMBERS ENCODED BY SEQUENCES OF SECTOR TYPES

(75) Inventors: Mario Blaum, San Jose; Steven R. Hetzler, Los Altos; William John Kabelac, Morgan Hill, all of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/153,591

(22) Filed: Sep. 15, 1998

(51) Int. Cl.[7] ............................................ G11B 5/09
(52) U.S. Cl. ............................ 360/49; 360/40; 360/77.08
(58) Field of Search ................................ 360/48, 77.08, 360/78.14, 49, 40, 53; 369/47.21, 47.22, 59.25, 124.07

(56) References Cited

U.S. PATENT DOCUMENTS

| 4,669,004 | | 5/1987 | Moon et al. ............................ 360/77 |
| 5,544,135 | * | 8/1996 | Akin, Jr. et al. ................... 360/46 X |
| 5,596,460 | | 1/1997 | Greenberg et al. ............... 360/78.14 |
| 5,615,190 | | 3/1997 | Best et al. ............................. 369/58 |
| 5,737,142 | * | 4/1998 | Zook ................................... 360/40 X |
| 5,757,567 | * | 5/1998 | Hetzler et al. ............... 360/78.14 X |
| 5,768,044 | * | 6/1998 | Hetzler et al. ................... 360/77.08 |
| 5,852,523 | * | 12/1998 | Jung ...................................... 360/49 |
| 6,005,727 | * | 12/1999 | Behrens et al. .............. 360/77.08 X |

OTHER PUBLICATIONS

Conway et al., "Redundant Index Code for Disk File", IBM Technical Disclosure Bulletin, vol. 32, No. 9A, Feb. 1990, pp. 94–95.

Danen et al., "Index Decode Validity Check Circuit", IBM Technical Disclosure Bulletin, vol. 26, No. 3B, Aug. 1983, pp. 1675–1676.

* cited by examiner

Primary Examiner—Andrew L. Sniezek
(74) Attorney, Agent, or Firm—Thomas R. Berthold

(57) ABSTRACT

A magnetic recording disk drive has head positioning servo sectors with servo sector numbers (SSNs) that are not recorded on the disk. The SSNs are encoded through the use of multiple servo sector types that are arranged in a specific sequence around the data tracks. The different servo sector types are identified by unique types of servo timing marks (STMs), which are used to locate the servo sectors. The SSNs that are used to identify the servo sectors on the track form a set or code of m fixed n-bit patterns. A SSN is determined when the STM types read from n sequential servo sectors match one of the fixed SSN patterns. A set or code of m servo sectors, where each servo sector is identified by a unique SSN pattern having length n, is denoted as an (m,n,d) code, where d is referred to as the minimum Hamming distance of the code. The Hamming distance between two patterns refers to the number of locations that are different between the two patterns.

15 Claims, 5 Drawing Sheets

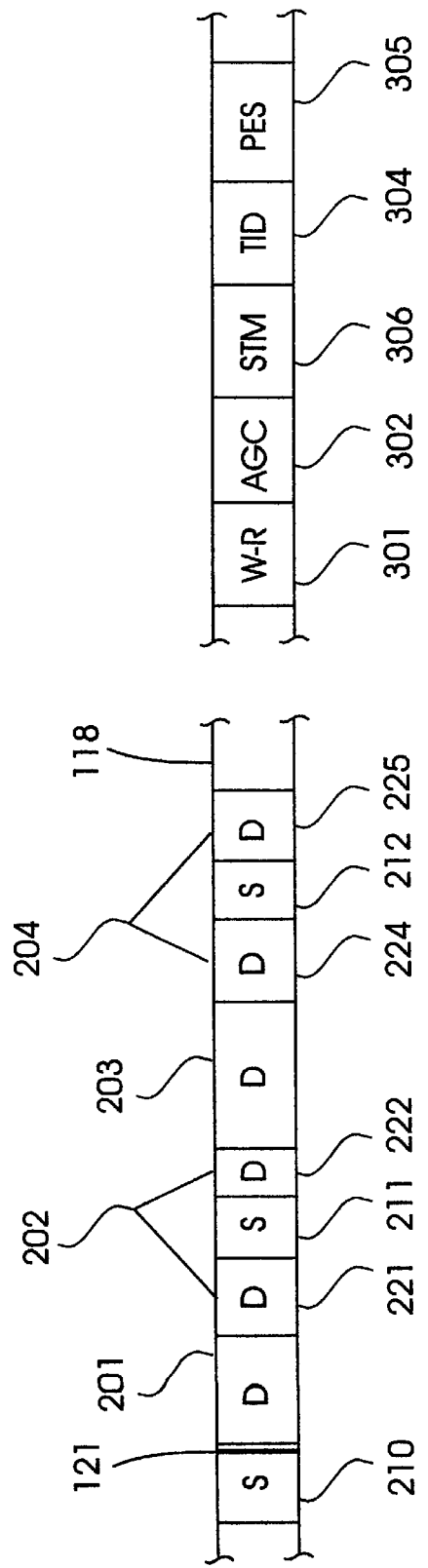
FIG. 2A (PRIOR ART)
FIG. 2B (PRIOR ART)
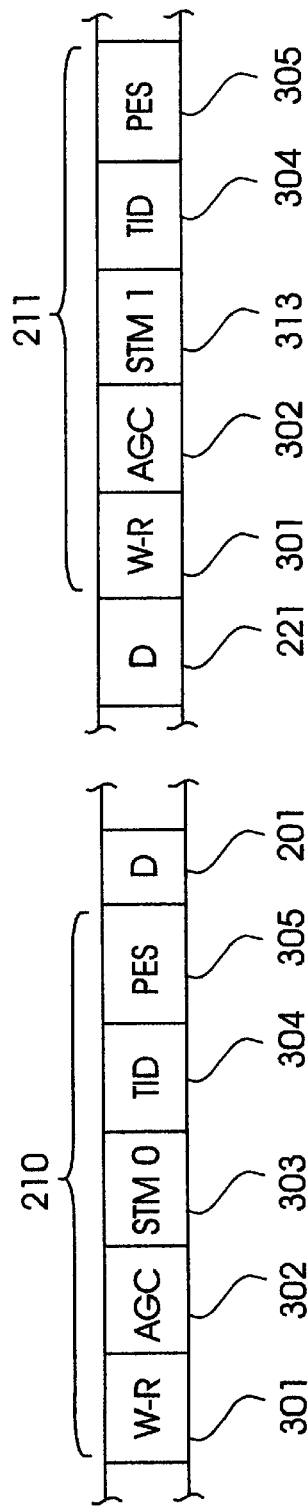
FIG. 3

| Sector | B0 | B1 | B2 | B3 | B4 | D0 | D1 | D2 | D3 | D4 | D5 | D6 | D7 | D8 |
|---|---|---|---|---|---|---|---|---|---|---|---|---|---|---|
| 0 | 0 | 0 | 0 | 1 | 0 | 3 | | | | | | | | |
| 1 | 1 | 0 | 0 | 0 | 1 | 2 | 3 | | | | | | | |
| 2 | 0 | 1 | 0 | 1 | 1 | 3 | 2 | 3 | | | | | | |
| 3 | 1 | 1 | 1 | 1 | 0 | 2 | 3 | 2 | 3 | | | | | |
| 4 | 0 | 1 | 1 | 1 | 1 | 5 | 2 | 3 | 2 | 3 | | | | |
| 5 | 1 | 1 | 1 | 0 | 1 | 2 | 5 | 2 | 3 | 2 | 3 | | | |
| 6 | 1 | 1 | 0 | 1 | 0 | 3 | 2 | 5 | 2 | 3 | 2 | 3 | | |
| 7 | 1 | 0 | 1 | 0 | 0 | 2 | 3 | 2 | 5 | 2 | 3 | 2 | 3 | |
| 8 | 0 | 0 | 0 | 0 | 0 | 3 | 2 | 3 | 2 | 3 | 2 | 3 | 2 | 3 |
| 9 | 1 | 0 | 0 | 0 | 1 | 2 | 3 | 2 | 3 | 2 | 5 | 2 | 3 | 2 |

DISK DRIVE WITH SECTOR NUMBERS ENCODED BY SEQUENCES OF SECTOR TYPES

TECHNICAL FIELD

This invention relates to disk drives that store recorded digital data, and in particular to disk drives that use servo sectors for maintaining the recording heads on the data tracks during read and write operations.

BACKGROUND OF THE INVENTION

Magnetic recording disk drives incorporate stacked, commonly-rotated rigid magnetic recording disks that are used for storage of user data. The data is recorded in radially-spaced data tracks on the surfaces of the disks. Recording heads are moved by an actuator in a generally radial path toward and away from the center of rotation of the disks to read and write data on the disks. Typically, a single recording head, which may be an inductive read/write head or an inductive write head in combination with a magnetoresistive read head, is associated with a corresponding magnetic recording surface of each disk.

It is necessary to know the precise radial and circumferential location of the recording heads relative to their associated disk surfaces. Radial position information is recorded on the disk as servo information and is used to locate the heads to the desired data tracks and maintain the heads over the desired data tracks during read and write operations. Circumferential position information is used to identify the start of different data fields located around the tracks. In conventional fixed-block architecture disk drives, the data is located in fixed bit length angular data sectors and the servo information is located in angularly-spaced servo sectors that are interspersed among the data sectors. This type of disk drive is referred to as a sector servo or embedded servo disk drive.

In most disk drives, it is important to accurately determine the servo sector number (SSN). This is especially true for disk drives using a headerless architecture, where there are no identification (ID) fields to locate the data sectors and the data sector numbers are derived from the SSNs. In some disk drive servo systems, the servo controller uses knowledge of the SSN to compensate for effects such as repeatable runout, which is a predictable head position error caused by the disk being not precisely centered over the axis of rotation of the spindle motor. In many disk drives, it is beneficial for the drive to determine the SSN as quickly as possible following a head switch, to speed read and write operations.

Accurate and rapid determination of SSNs is also especially important in disk drives used in portable or laptop computers that use idle modes to reduce power consumption. A typical idle mode will turn off power to the read, write and servo electronics, but keep the disk spinning. This provides for a significant power saving, but suffers from a recovery delay in returning to the fully operational (active) state. In a headerless drive, data read or write operations require knowledge of the SSN. Acquiring the SSN quickly can significantly reduce the recovery delay. Improving the recovery latency will provide additional opportunities for reducing drive power consumption using one or more of these idle modes.

In the prior art, the SSN is determined using any of a number of methods. The most common methods used are encoding an index mark on the track, and counting the SSNs from the index mark; and recording the SSN within the servo sector and then reading the SSN. Variations include combinations of these techniques, where both an index mark and some portion of the SSN are encoded within the servo sectors. However, all of these methods are susceptible to errors in the servo sectors, compromising reliability. Errors in the index sector may result in the loss of index, and errors in other sectors may cause loss of the associated SSN. The index plus count method suffers from a large latency when initially acquiring the SSN, since it must make a determination of the index location. Recording the SSN within the servo sectors reduces the disk drive's data storage capacity due to the overhead of the increased number of bits in the servo sector.

What is needed is a disk drive that can accurately and rapidly identify the servo sectors without reducing the data storage capacity.

SUMMARY OF THE INVENTION

In the present invention the SSNs are not recorded on the disk but are encoded in a manner that greatly enhances reliability of decoding the SSNs without impacting the data storage capacity of the disk. The SSNs are encoded through the use of multiple servo sector types that are arranged in a specific sequence around the data tracks. In the preferred embodiment the different servo sector types are identified by unique types of servo timing marks (STMs), which are used to locate the servo sectors. The SSNs that are used to identify the servo sectors on the track form a set or code of m fixed patterns n-bits in length. A SSN is determined when the STM types read from n sequential servo sectors correspond to one of the m fixed SSN patterns. A set or code of m servo sectors, where each servo sector is identified by a unique SSN pattern having length n, is denoted as an (m,n,d) code, where d is referred to as the sliding distance or the minimum Hamming distance of the code. The Hamming distance between two patterns refers to the number of locations that are different between the two patterns. The evaluation of a pattern of sequential STM types as the head reads successive servo sectors begins with serial bits being converted to parallel bytes. An n-bit SSN shift register is used for storing a pattern of n bits in length. Each shift creates a new pattern whose Hamming distance is compared with each of the known predetermined m SSN patterns. Determination of an SSN pattern, and thus identification of a servo sector, occurs when the input pattern either matches or where the Hamming distance is sufficiently close to one of the m SSN patterns.

The invention is not limited to servo sector number encoding and decoding in a magnetic recording disk drive, but is more broadly applicable to a wide range of systems for determining data packet identification numbers in a sequence of data packets in a cyclic manner. For example, in an optical or magnetic recording disk or tape drive that uses header fields in the recording media, the user data sectors may be thought of as the data packets and their numbers encoded and decoded in the manner according to the present invention. Similarly, a data communication stream may be comprised of a set of data packets transmitted in sequence, with unique packet type values encoded in each packet, and the sequence of packet type values used to determine the packet numbers.

For a fuller understanding of the nature and advantages of the present invention, reference should be made to the following detailed description taken together with the accompanying figures.

BRIEF DESCRIPTION OF THE DRAWING

FIG. 2A is an illustration of the track format for the prior art disk drive of FIG. 1 illustrating data sectors split by servo sectors.

FIG. 2B is an illustration of a servo sector in the track format of the type shown in FIG. 2A.

FIG. 3 is an illustration of the servo sectors in the track format of the type shown in FIG. 2A, but with two unique types of servo timing marks (STMs) for use with the present invention.

DETAILED DESCRIPTION OF THE INVENTION

Prior Art

Figure 1:
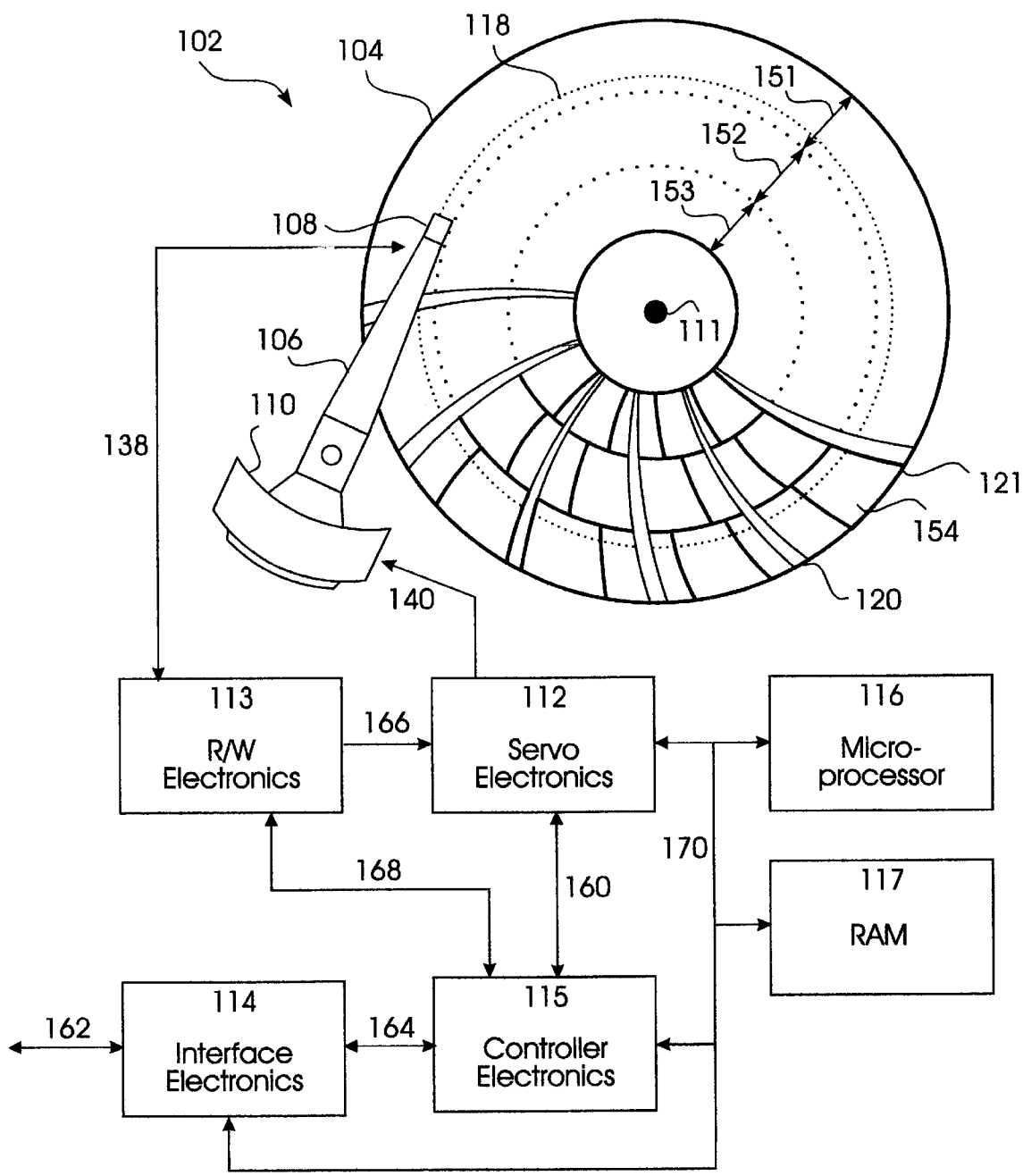
FIG. 1 is a block diagram of a prior art disk drive with a zoned recording, embedded servo, fixed-block architecture and is representative of the type of disk drive capable of incorporating the present invention.

FIG. 1 is a block diagram of a disk drive of the type usable with the present invention. The disk drive depicted is one that is formatted using a fixed-block "headerless" architecture with sector servo and zone-bit recording (ZBR).

The disk drive, designated generally as 102, includes data recording disk 104, actuator arm 106, data recording transducer 108 (also called a recording head), voice coil motor 110, servo electronics 112, read/write electronics 113, interface electronics 114, controller electronics 115, microprocessor 116, and RAM 117. The recording head 108 may be an inductive read/write head or a combination of an inductive write head with a magnetoresistive read head. Typically, there are multiple disks stacked on a hub that is rotated by a disk motor, with a separate recording head associated with each surface of each disk. Data recording disk 104 has a center of rotation 111, and is divided for head positioning purposes into a set of radially-spaced tracks, one of which is shown as track 118. The tracks are grouped radially into a number of zones, three of which are shown as zones 151, 152 and 153. The disk contains a plurality of servo sectors 120, which extend across the tracks in a generally radial direction. Each track has a reference index 121 indicating the start of track. Within each zone, the tracks are also circumferentially divided into a number of data sectors 154 where user data is stored. The data sectors contain no data sector identification (ID) fields for uniquely identifying the data sectors so that the drive is considered to have a "No-ID™" brand of data architecture, also called a "headerless" data architecture. If the disk drive has multiple heads, then the set of tracks which are at the same radius on all disk data surfaces is referred to as a "cylinder".

Read/write electronics 113 receives signals from transducer 108, passes servo information from the servo sectors 120 to servo electronics 112, and passes data signals to controller electronics 115. Servo electronics 112 uses the servo information to produce a current at 140 which drives voice coil motor 110 to position recording head 108. Interface electronics 114 communicates with a host system (not shown) over interface 162, passing data and command information. Interface electronics 114 also communicates with controller electronics 115 over interface 164. Microprocessor 116 communicates with the various other disk drive electronics over interface 170.

In the operation of disk drive 102, interface electronics 114 receives a request for reading from or writing to data sectors 154 over interface 162. Controller electronics 115 receives a list of requested data sectors from interface electronics 114 and converts them into zone, cylinder, head, and data sector numbers which uniquely identify the location of the desired data sectors. The head and cylinder information are passed to servo electronics 112, which is responsible for positioning recording head 108 over the appropriate data sector on the appropriate cylinder. If the cylinder number provided to servo electronics 112 is not the same as the cylinder number over which recording head 108 is presently positioned, servo electronics 112 first executes a seek operation to reposition recording head 108 over the appropriate cylinder.

Once servo electronics 112 has positioned recording head 108 over the appropriate cylinder, servo electronics 112 begins executing sector computations to locate and identify the desired data sector. As servo sectors 120 pass under recording head 108, the headerless architecture approach described in IBM's U.S. Pat. No. 5,615,190 is used to identify each servo sector. In brief, a servo timing mark (STM) is used to locate servo sectors, and a count of STMs from a servo sector containing an index mark 121 uniquely identifies each servo sector. Additional information is maintained in association with servo electronics 112 and controller electronics 115 for controlling the read or writing of data in the data sectors.

Referring now to FIG. 2A, a portion of a typical track 118 on the disk 104 is shown expanded. Four complete data sectors are shown (201, 202, 203 and 204). Three representative servo sectors 210, 211, and 212 are also shown. As can be seen from this example, some data sectors are split by servo sectors, and some data sectors do not start immediately following a servo sector. For example, data sectors 202 and 204 are split by servo sectors 211 and 212, respectively. Data sector 202 is split into data sections 221 and 222, and data sector 204 is split into data sections 224 and 225. Data sector 203 starts immediately after the end of data sector 202, rather than immediately following a servo sector. The index mark 121 indicates the beginning of the track and is shown contained in servo sector 210. FIG. 2B is an expanded view of one of the servo sectors illustrated in FIG. 2A. Typically, each servo sector contains an STM 306. The STM 306 serves as a timing reference for reading the subsequent servo information in track identification (TID) field 304 and position error signal (PES) field 305. The STM is sometimes also referred to as a servo address mark or servo start mark.

The TID field 304 typically includes a servo sector number (SSN) for uniquely identifying the servo sector. As described in the background, it is important to accurately determine the SSNs. However, recording the actual SSN within the servo sectors, such as within the TID, reduces the data storage capacity due to the overhead of the increased number of bits in the servo sector.

Most disk drives today use multiple servo sector types to encode index, i.e., the start of a data track. One servo type would indicate index, the other servo type not index. There are many methods where information within the servo sectors is used to encode a servo type. The most common method is to encode the servo type within the TID field 304.

One bit location in the TID field is used to indicate the two servo types. A value of 0 might indicate index, and a value of 1 non-index. All the STMs 306 on a track would then have the same bit pattern. Another method is to use different STMs to encode the servo type. In IBM's pending application Ser. No. 08/823,435 filed Mar. 24, 1997, a method is described where 1 STM type may be used to indicate index, and other STM types indicate non-index. In still other cases, a third servo type is used to encode an alternate index location. Further, it is possible to record the servo type by using information within the PES field, and then decoding the servo type value from the PES information. For example, U.S. Pat. No. 4,669,004 assigned to Quantum Corporation discloses recording the track ID information with the PES fields.

It is beneficial to encode the servo type with some form of error protection. Known techniques include encoding the servo type using multiple bit locations in one of the servo fields, recording multiple copies of the servo type bit, and using an ECC code, such as parity. When there are 2 servo types, a 3-bit ECC code may be used which has a Hamming distance of 3, allowing for the correction of up to 1 error in the pattern. For example, one of the servo types may be encoded with the pattern 010, and the other with the pattern 101. A more robust method is described in the above-referenced pending application Ser. No. 08/823,435, wherein the STMs themselves are encoded using an error correcting code which allows for error correction and detection for multiple STM types.

PREFERRED EMBODIMENTS

Operation of the Servo System With the STMs

The present invention encodes the SSN onto the disk without impacting the data storage capacity, and simultaneously greatly enhancing the reliability. In the preferred embodiment the SSNs are encoded in a distributed manner through the use of multiple servo types encoded in the STMs in a specific sequence.

FIG. 3 is a detailed view of a portion of a data track, such as the data track 118 depicted in FIG. 2A, illustrating the contents of the two servo sectors 210 and 211, which are identical except that each contains a different one of the two types of STMs which represent two servo types that are used to encode SSNs according to the present invention.

The servo sector 210 includes a write-to-read recovery (W-R) field 301, a servo sector preamble pattern shown as field 302, a servo timing mark STM0 303, track identification (TID) field 304 and position error signal (PES) field 305. The W-R field 301 provides time for the recording system to switch from writing data to reading servo information. It also provides timing tolerance for fluctuations in the spindle motor speed, and other effects. The preamble field 302 is shown in this embodiment as an automatic gain control (AGC) field. The preamble field 302 is a constant frequency signal, typically an all "ones" pattern, that is used to distinguish the following STM pattern from the prior fields, and is also typically used to adjust the gain of the read amplifier and is necessary for the accurate reading of servo information. In the preferred embodiment, the servo types are encoded in the servo sector information through the use of a set of STM patterns: STM0, which is servo type 0, and STM1, which is servo type 1. The STM0 303 is a timing alignment mark that provides an accurate reference point that marks a unique location within a servo sector 210, and is used to locate the subsequent servo information that follows, i.e., it allows the servo system to read the TID field 304 and the PES field 305. The STM0 303 is also used to provide timing for locating data sectors, to help locate subsequent servo sectors, and to assist in error handling. The TID field 304 contains information on the coarse head location, including the track number and head number. The track number changes from track-to-track, and is typically encoded using a Gray code. The TID field 304 does not contain the SSN because in the present invention the SSNs are determined from the pattern of servo types identified from successive preceding servo sectors. The PES field 305 contains bursts that are decoded into very accurate radial position information used to precisely align the head for read and write operations.

The succeeding servo sector 211 is identical to servo sector 210 except that the STM is a second type of STM, denoted STM1, different from STM0. Thus, as shown in FIG. 3 and as will be explained in detail below, in the preferred embodiment there are only two types of STMs recorded on the disk, which provide the two servo types. They are identified by the disk drive servo electronics when read by the head and are represented digitally as a servo type "zero" bit (STM0) and a servo type "one" bit (STM1). The sequential pattern in which the STM0 and STM1 types are recorded in sequential servo sectors is decoded by the servo electronics and used to decode the SSN. The SSNs thus mark physical locations on the data track.

Figure 4:
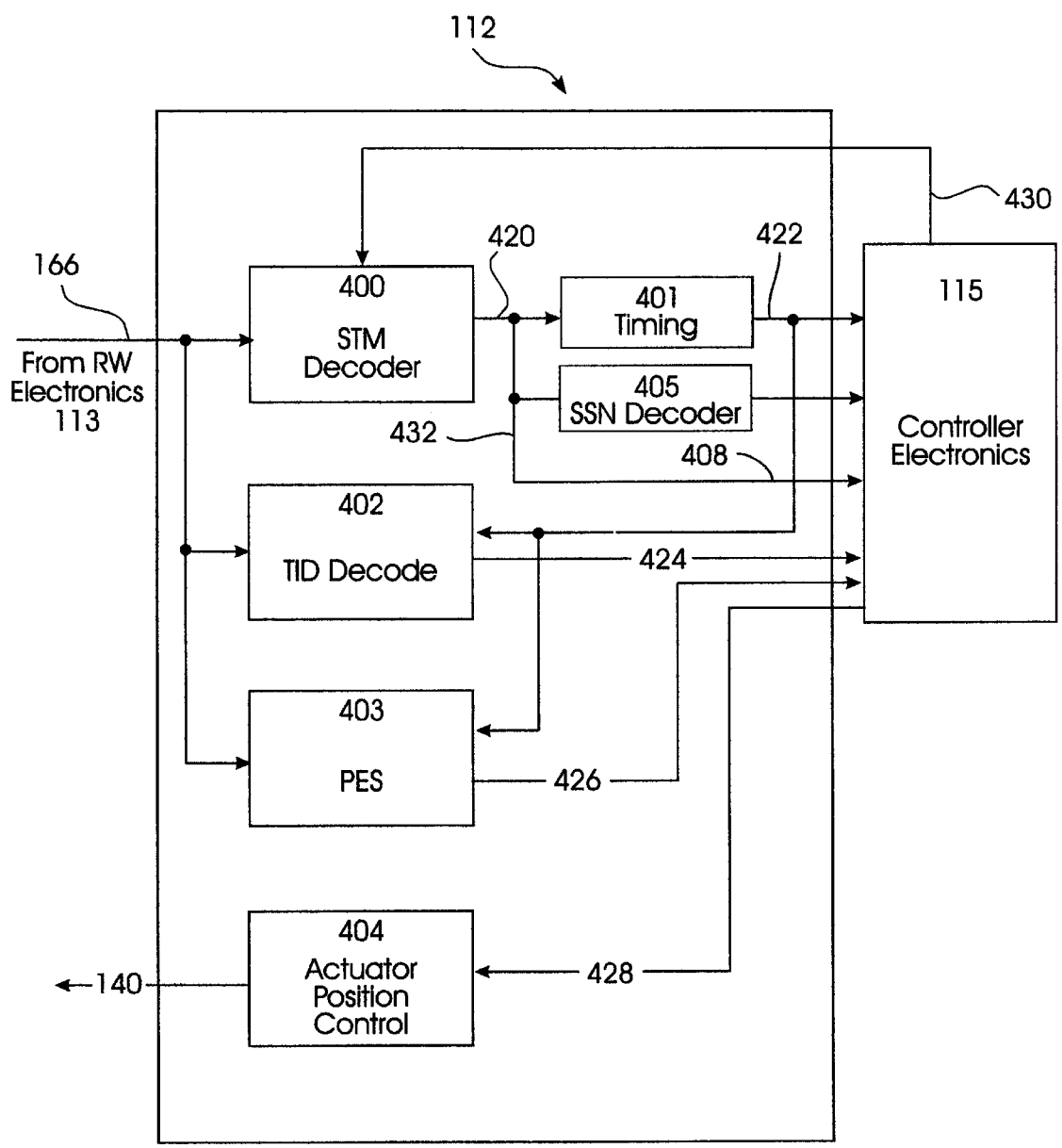
FIG. 4 is a block diagram of the servo electronics of the present invention, including the servo type identifier and the index detector.

FIG. 4 is a detailed block diagram of the servo electronics 112. In operation, controller electronics 115 provides input to actuator position control 404, which in turn provides a signal 140 to the actuator to position the head. The controller electronics 115 uses the servo information read from the servo sectors to determine the input to the actuator position control. The servo information is read by the read/write electronics 113 (FIG. 1), and signals 166 are input to the servo electronics 112. STM decoder 400 receives a clocked data stream 166 as input from the read/write electronics 113, and a control input 430 from the controller electronics 115. Once an STM has been detected, an STM found signal 420 is generated. The STM found signal 420 is used to adjust timing circuit 401, which controls the operating sequence for the remainder of the servo sector, and is also sent to controller electronics 115.

After detection of an STM, the TID decoder 402 receives timing information from timing circuit 401, reads the clocked data stream 166, which is typically Gray-code encoded, and then passes the decoded TID information 424 to controller electronics 115. Subsequently, PES decode circuit 403 captures the PES signal from read/write electronics 166, then passes position information to controller electronics 115. Inputs to the PES decode circuit 403 are typically analog, although they may be digital or of any other type. The PES decode circuit 403 need not reside within the servo electronics module 112.

Each of the two STM types is a bit pattern that is distinct from the preamble field 302 (FIG. 3). When the servo type is encoded within the STM, the STM decoder 400 includes decoding circuitry that also identifies the STM that is found as either a servo type 0 or a servo type 1, corresponding to whether STM0 or STM1, respectively, has been found. This information 432 is sent to SSN decoder 405. The present invention is fully applicable with any specific STM or servo pattern, including those well known in the art, provided the servo pattern is capable of being decoded into multiple servo types so that digital "zeros" and "ones" 432 can be input to the SSN decoder 405. The connection 432 is shown connected to STM decoder 400. However, it would be connected to TID decoder 402 or PES 403 as appropriate if the servo types were encoded in those fields. In a simple embodiment used for the purpose of explanation, each STM can be a sync byte of three 0's followed by a 1, and then a subsequent bit is used to identify the STM as one of two types. Thus STM0 would be 00010 and STM1 would be 00011. A parity bit can be used to improve error detection capability. Thus when the STM decoder 400 detects a parity error, the location of the servo sector with the erroneous STM is known, but the identification of the STM as being a STM0 or STM1 type is not known. Any method for providing multiple servo types may be used, including those described in the prior art section above. In addition, the present invention is operable with the multiple STM pattern technique described in IBM's pending application Ser. No. 08/823,435 filed Mar. 24, 1997.

The servo type 0 and servo type 1 bits 432 from STM decoder 400 are sent sequentially to SSN decoder 405 as the head reads sequential servo types from sequential servo sectors on the track. The detailed operation of SSN decoder 405 to decode the SSNs will be described in detail with respect to FIG. 6. In general, there exist patterns of servo types that result in a SSN being decoded for every servo sector for any number of servo sectors.

Figures 5A, 5B:
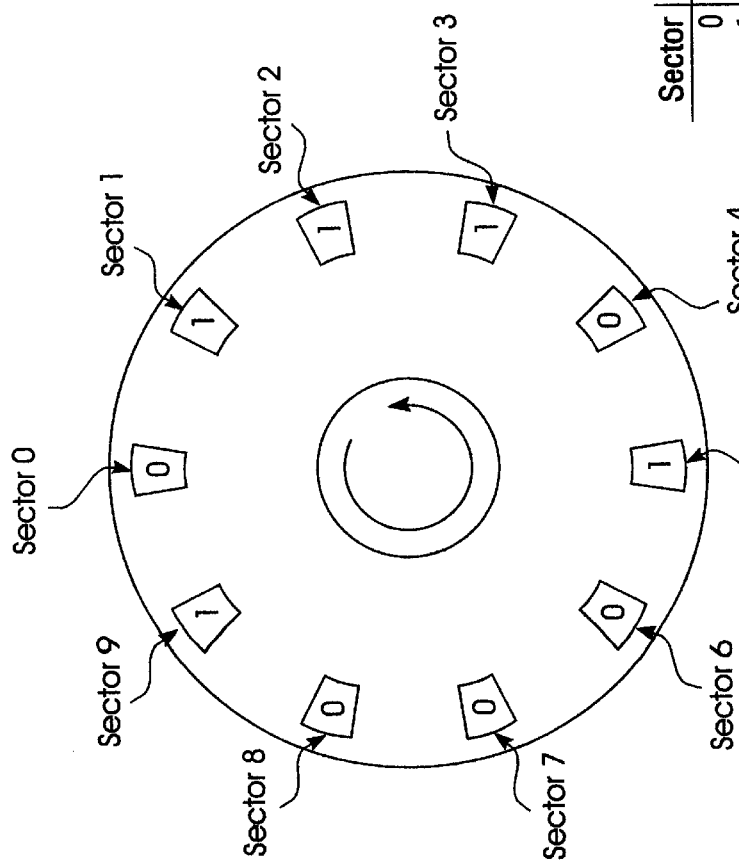
FIG. 5A is a schematic of a disk with a track having 10 equally spaced sectors, where the sequence of sector types encodes the sector numbers in a distributed manner.
FIG. 5B is a table showing the 10 unique predetermined 5-bit servo sector number patterns for the 10 servo sectors represented in FIG. 5A.

FIG. 5A shows an embodiment of the present invention with 10 servo sectors in a track, with each servo sector being either a servo type 0 or a servo type 1. Each servo sector type represents the last bit of one of the 10 unique predetermined 5-bit SSN patterns, which are shown in the table of FIG. 5B. The columns labeled B0 . . . B4 in the table show the bits corresponding to the sequence of read servo types. The values shift from right to left, as indicated. In this example, the most recent 5 servo type bits are used to determine the SSN. The columns labeled D0 . . . D8 show the Hamming distances between the pattern for each servo sector and the patterns for each of the previous servo sectors. For example, servo sector 2 has D0=2 and D1=3. This means that the pattern for servo sector 2 has a Hamming distance of 2 to the pattern for servo sector 0, and a Hamming distance of 3 to the pattern for servo sector 1. Examination of these columns show that the Hamming distance between any 2 patterns is at least 2. The number of servo sectors on a track is denoted by m, the length of a SSN pattern by n, and the minimum Hamming distance or sliding distance by d. In FIG. 5B, m=10, n=5 and d=2. The specific number of servo sectors shown in FIGS. 5A–5B is by way of example only.

The Servo Sector Number Patterns

In the present invention, error-tolerant SSNs are achieved by using a set or code of fixed SSN bit patterns, where the SSN patterns have a specified minimum Hamming distance against all the patterns in the search. This minimum Hamming distance is called the sliding distance of the code and is denoted by d. The Hamming distance between two patterns refers to the number of locations that are different between the two patterns. Operationally, if the patterns are bits for instance, the Hamming distance is calculated by exclusive OR'ing the two patterns and counting the number of 1's. The sliding distance for a set of patterns determines its error correction power as described below.

The pattern evaluation process begins with serial bits, output from the R/W electronics, being converted to parallel bytes. A SSN shift register of length n is used for storing a pattern of n bits in length. Each shift or slide creates a new pattern whose Hamming distance is compared with each of the m SSN patterns. Identification of an SSN pattern occurs when the input pattern either matches or when the Hamming distance is sufficiently close to one of the m SSN patterns (the complete process is described below). The concept of sliding distance describes the behavior of the patterns when viewed through this shift register. The shift register can be thought of as a window that slides along the input data. Error correction/detection capability of the SSNs depends on maintaining a minimum distance between the shift register contents and each of the fixed SSN patterns. In the preferred embodiment it is assumed that each of the m SSN patterns has the same length n. This is not required, and the invention can be implemented with patterns of differing lengths as well. Further, while the process has been described for a serial bit pattern, it is clearly applicable to a parallel bit stream as well. For example, the bits may read directly into a parallel register of width n. An example of such a design might be a rotary shaft encoder, with n sensor elements.

Normally, each servo type will be correctly determined as a 0 or 1 since it is preferred to use some form of error protection on the servo type. In the preferred embodiment, the servo types are encoded using two STM patterns that have error correcting properties. In some instances, a type 0 servo will be detected as a type 1, or a type 1 as a 0 due to errors. One purpose of this invention is to tolerate these types of errors. There is another possibility as well. There are instances when the servo type can't be identified, therefore it is not known if it is a type 0 or a type 1. This can occur when errors prevent the reading of the servo type. In the preferred embodiment, the STM patterns will correct a certain number of errors, and detect further errors. If the number of errors is greater than the number that can be corrected, but within the number which are detectable, an STM not found error occurs and the servo type is unknown. If the servo type is encoded otherwise, such as within the TID field, then any error that prevents reading of the information will also result in the servo type being unknown. The event where the servo type is unknown is called an erasure, and is denoted by a "?" in the pattern. An erasure, therefore, is an error whose location is known. The present invention will decode the SSN correctly in the presence of both errors and erasures.

The following parameters define the code or set of SSN patterns:

d=sliding distance of the code, which is the minimum of the distances between each of the consecutive m n-bit shifts and each of the m SSN patterns;

e=number of erasures, $e \leq d-1$;

s=number of correctable errors provided that e erasures have occurred; and s+t=number of detectable errors provided that e erasures have occurred, and up to s errors are corrected.

The error correcting and detecting properties are determined from the sliding distance d, according to the following inequality:

$$d \geq 2s+e+t+1 \qquad \text{(Eq. 1)}$$

Assume that e erasures have occurred, where $e \leq d-1$, then if $2s+t \leq d-e-1$, the code can correct up to s errors, and if the number of errors exceeds s, can detect up to s+t errors. For example, consider a code where sliding distance is d=4. Therefore, according to Eq. 1, if there are no erasures then 1 bit in error can be corrected and the situations with 2 or 3 bits in error can be detected. If exactly 1 erasure occurs, then 1 bit in error can be corrected together with the erasure, but no extra errors may be detected. If exactly 2 erasures occur, then the two erasures will be corrected if no extra error occurs. If an extra error occurs, then the error will be detected. Finally, if exactly 3 erasures occur, they will be corrected as long as no extra error occurs. It should be noted that limits on the number of errors and erasures apply to any span of length n. Further, an error condition is detected when e>d−1, since the number of erasures within any n-bit span can be counted. The error condition is cleared, and normal operation continues when e≦d−1.

Counting the number of erasures is useful when the process of decoding a SSN is initiated, such as following a head switch, when a new set of servo types will be read. In this situation, comparison of SSN patterns begins when n servo types have been read. However, the number of servo types that must be read prior to the initial comparison can be reduced by treating the types yet to be read as erasures. In this case, upon initialization, an erasure counter would be set to n. The erasure count is decremented each time a servo type value is read, but not decremented if an erasure occurs. The comparison then begins when e≦d−1. Such a process relies on having the probability of an erasure exceeding the probability of an error, such as when error detection is employed in determining the servo type.

A code of m servo sectors, each SSN pattern having length n, and having a sliding distance d, is denoted as an (m,n,d) code. In the present invention as described with respect to the track shown in FIG. 5A, there are 10 servo sectors whose SSNs are determined such that each of them is identified when the last servo type bit in a 5-bit pattern of sequential servo type bits is decoded from 5 sequential servo sectors. FIG. 5B depicts a (10, 5, 2) code where the sliding distance is 2. The bit length n of the SSN patterns is tailored according to the bit failure mechanism and desired speed of determining an initial SSN. Typical failure mechanisms include erasures (where the servo type is unknown), and servo type errors (where the servo type is misidentified). Further, even though the servo sectors are widely separated along the track, an error in a given servo sector may be correlated with an error in a subsequent servo sector along the track. The most likely scenario occurs when an STM is not readable, resulting in loss of all the servo information. Since the STM tends to be used as the timing reference for locating the subsequent STM, the probability of error in locating subsequent STMs is increased. As explained previously, if error detection is built into each of the servo types, such as by use of parity, so that there is a high probability of knowing that a servo type has been correctly identified as a type 0 or type 1, then the SSN code allows for detection of a SSN even when errors are detected during the process of identifying the servo types.

SSN Code Generation

SSN codes, such as the (10,5,2) code of FIG. 5B may be generated in a straightforward manner, for any number of servo sectors. Such codes may be constructed, for example, by computer search, where patterns of length m are sequentially searched for the property that every pattern of n consecutive bits has sliding distance d to the entire pattern of length m, including wrapping around at the end. For example when m=11 and d=2, the minimum pattern length is calculated as n=6. One such pattern is 00001011101. It can be verified that each of the 11 6-bit patterns has a sliding distance of 2 to all but the proper SSN locations.

One method for generating (m,n,d) codes is described as follows:

1. Select a track pattern of length m, for example, by a sequential search.
2. Generate the list of m patterns of length n bits that are the sequential n-bit sequences of the track pattern, including the wrap.
3. Compute the Hamming distances between each of the elements of the list generated in step 2.
4. If the minimum of the Hamming distances computed in step 3 is at least d, then the pattern chosen in step 1 is a (m,n,o code; otherwise, return to step 1 and select a new pattern.

As an option, the initial track pattern of step 1 may be determined from a similar code with a different m value. For example, a code for m=62 is likely to have very similar sequences to a code for m=60. Exhaustive searches are reasonably fast for small m values, and using the codes found there as starting points for larger m values will substantially reduce the search time.

Table 1 lists some (m,n,d) codes, for a range of SSNs and a sliding distance of d=4. This distance is very useful, since it can correctly identify SSNs under a wide range of conditions, including one erasure (unknown servo type) and one error, or up to 3 erasures. Further it can detect 2 or 3 errors, 2 erasures and 1 error, or 1 erasure and 2 errors. Note that the codes of the same n value shown below have similar bit sequences. This is the result of using the optional search initialization step described above. As described above, it is possible to generate codes for other values of d. In general, larger values of d will result in larger values of n for a given value of m. A value of d=1 will result in the smallest value of n.

TABLE 1

Some (m,n,4) codes.

| m | n | Pattern |
| --- | --- | --- |
| 60 | 14 | 000000010011000011111101001101011001111100111001010101001011 |
| 62 | 14 | 00000100110000111111010011010110011111001110010010101010010110 |
| 64 | 14 | 0000000100110000111111010011010110011111001110010010101010010110 |
| 66 | 14 | 010011000011111101001101011001111100111001010000010100101011100010 |
| 68 | 14 | 00010011000011111101001101011001111100111001011010000010101011000010 |
| 70 | 14 | 0000010011000011111101001101011001111100111001011010000010101011011100 |
| 72 | 15 | 000001011000111010001011001000010011010101010010110111100011001110110000 |
| 80 | 15 | 00000000010110001110100010110010000100110101010100101101111110010101101000100111 |
| 84 | 15 | 000001011000111010001011001000010011010101010010110111111010111011110001101001110000 |

TABLE 1-continued

Some (m,n,4) codes.

| m | n | Pattern |
|---|---|---------|
| 90 | 15 | 000000010110001110100010110010000100110101010100101101111110101111000001100011010011101100 |

Once a code has been identified, it is obvious that there are a number of equivalent codes. For example, all rotations of a given code are also codes, as is the code generated by inverting the bit pattern of a code (i.e., swapping 1's and 0's), and reversing the order of a code is also a code.

The above method for generating codes can be easily modified to produce other codes which correct burst errors. For burst codes, the Hamming distance is modified to be the number of bursts of a predetermined length in which two values differ. For example, 00000101101 is an m=11, n=7, d=2 code for bursts of length 2. Table 2 below shows the Hamming burst distances between the various SSNs. The first column is the SSN, the second the bit pattern, and the columns labeled D0 . . . D9 the burst Hamming distances between the SSN pattern for the row and the pattern for SSN i. Consider the patterns for servo sector 0 and servo sector 1. The value D0 indicates that SSN0 and SSN1 differ by 3 bursts of length 2. This is apparent by inspection. Starting from the left, the patterns differ at bits 2, 3, 4, 6 and 7. However, bits 2 and 3 belong to the same burst, and bits 6 and 7 belong to the same burst, so the burst Hamming distance is 3.

TABLE 2

A (11,7,2) code for 2-bit bursts.

| SSN | Pattern | D0 | D1 | D2 | D3 | D4 | D5 | D6 | D7 | D8 | D9 |
|-----|---------|----|----|----|----|----|----|----|----|----|----|
| 0 | 0101101 | | | | | | | | | | |
| 1 | 0010110 | 3 | | | | | | | | | |
| 2 | 0001011 | 2 | 3 | | | | | | | | |
| 3 | 0000101 | 2 | 2 | 2 | | | | | | | |
| 4 | 0000010 | 3 | 2 | 2 | 2 | | | | | | |
| 5 | 1000001 | 2 | 4 | 3 | 2 | 2 | | | | | |
| 6 | 0100000 | 2 | 2 | 3 | 3 | 2 | 2 | | | | |
| 7 | 1010000 | 4 | 2 | 3 | 4 | 3 | 2 | 2 | | | |
| 8 | 1101000 | 3 | 3 | 2 | 3 | 3 | 3 | 2 | 2 | | |
| 9 | 0110100 | 2 | 2 | 3 | 2 | 2 | 4 | 2 | 2 | 3 | |
| 10 | 1011010 | 4 | 2 | 3 | 4 | 2 | 2 | 3 | 2 | 2 | 3 |

The above method for generating (m,n,d) codes can also be modified to produce codes which provide SSNs at less than all the servo sectors. In this case, at step 3, only the patterns from the desired SSN locations would be tested for Hamming distance against the list generated in step 2. In general, the codes that produce a SSN at every servo sector are preferred, since any subset of the SSNs may be decoded. However, there may be certain instances where a special code would have a smaller length n for the same m and d values, and be better suited to some specific applications.

Decoding Circuitry for the SSN Code

Figure 6:
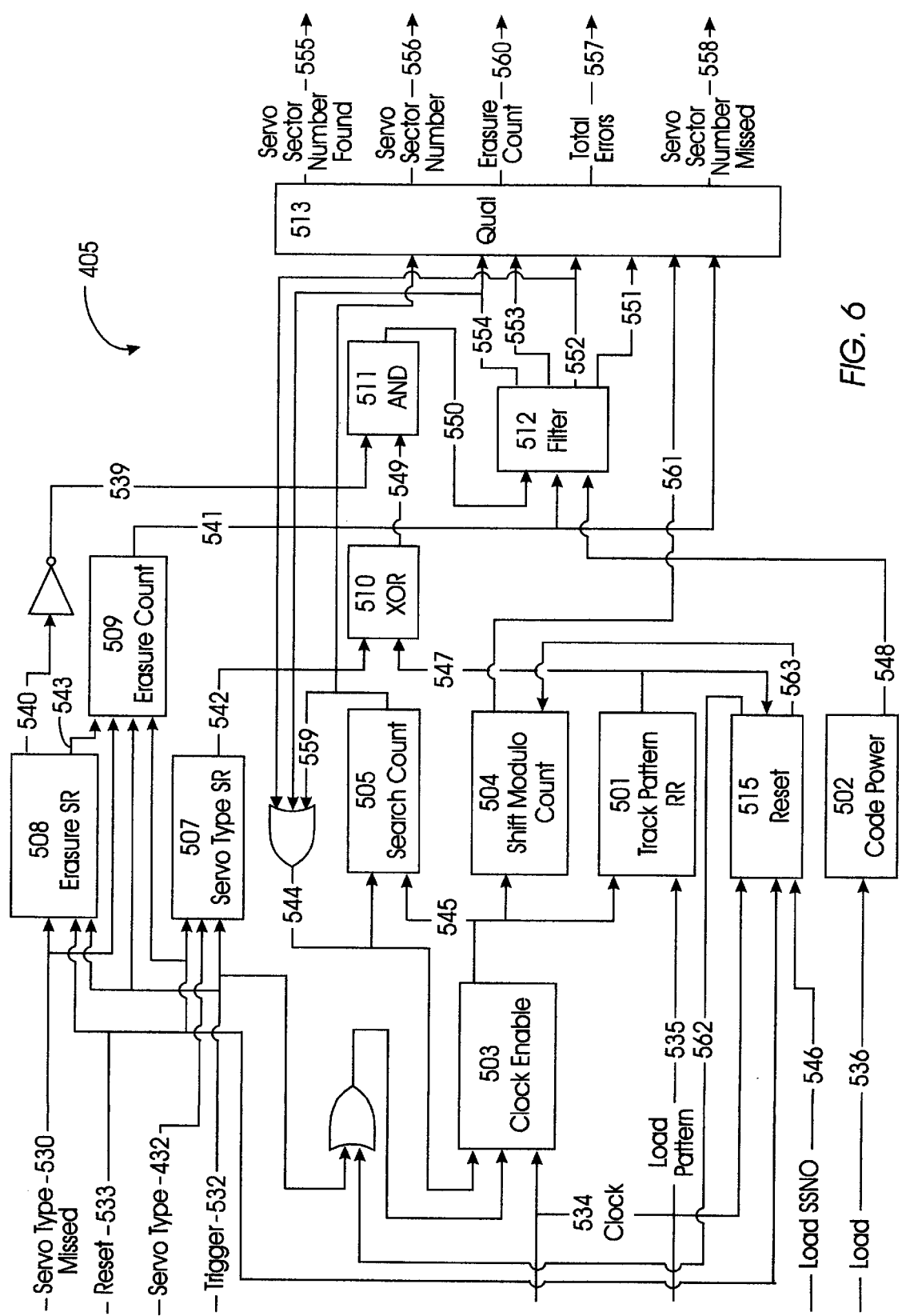
FIG. 6 is a detailed block diagram of the servo sector number decoder of the present invention.

FIG. 6 is a circuit diagram of SSN decoder 405 for use with codes of the type shown in FIG. 5. Servo type shift register (SR) 507 and erasure SR 508 are both n bits in length, and are clocked together by trigger 532. Servo type SR 507 holds the servo types read from the disk, and erasure SR 508 holds the servo type missed flag values for the corresponding servo type values. When the servo type is known, the servo type missed flag is reset and clocked into the erasure SR 508. When the servo type is not known, the servo missed flag is set and clocked into erasure SR 508, and the value in servo type SR 507 is not important. Track pattern rotating register (RR) 501 holds the m servo sector types. A consecutive set of n values is output 547 for comparison at 510 with the pattern read from the disk 542, resulting in an n bit pattern 549 which rotates through the entire track pattern. Erasure counter 509 is an up/down counter. The count increments upon trigger 532 if the servo type missed 530 is set. The count decrements upon trigger 532 if the last bit 543 in erasure SR 508 is set. The count is not changed at trigger 532 in the following situations: both 543 and 530 are set; or both 543 and 530 are not set. Counter 509 thus holds the number of erasures stored with erasure SR 508. Other functionally equivalent counter designs are clearly possible, such as substituting an adder, which sums the number of set bits at the parallel output of erasure SR 508.

Clock enable 503 controls the propagation of clock cycles 545 from input clock 534 to the indicated modules. Shift modulo counter 504 is a modulo m counter which holds the SSN corresponding to the output servo type pattern 547. Shift modulo counter 504 is kept in step with track pattern RR 501, as they both are clocked by 545. Search counter 505 counts down from m on clock 545.

The SSN decoder 405 is initialized by loading the track pattern into track pattern RR 501 via 535. The SSN 0 pattern is loaded into reset circuit 515 via 546. The code power register 502 is preloaded with the code properties e, d and t at 536. Reset 533 clears the servo type SR 507, clears the erasure SR 508 and presets the erasure count value in 509 to n, the length of a SSN pattern. Reset 533 is also sent to reset circuit 515, which generates trigger 562. Trigger 562 initiates propagation of clock 534 through clock enable 503. Clock cycles 545 thus clock track pattern RR 501 until the output 547 matches SSN 0 at reset 515. Shift modulo counter 504 is then reset via 563. This operation guarantees that shift modulo counter 504 will indicate SSN 0 when the SSN 0 pattern is present at output 547.

As the disk spins during operation, servo types 432 are determined from the servo sectors, or are determined to be missed. Trigger 532 is provided once the servo type has been determined and clocks the servo type 432 into servo type SR 507. Trigger 532 also docks the servo type missed value 530 into erasure SR 508. Trigger 532 also docks erasure counter 509, which increments if the servo type was missed, and decrements if it was not missed. Trigger 532 also provides start signal 532 to clock enable 503, which passes the clock signal 534 to its output 545. Clock 534 is a clock of sufficient speed to perform the index evaluation in a short period of time. Clock 534 may, for example, be the servo timing clock from timing electronics 401 (FIG. 4), which is used to decode the TID. At each cycle of clock 545, n bits 547 of the track pattern RR 501 are passed to XOR circuit 510. At each clock 545 n bits 547 of the rotated track pattern are exclusive OR'ed (XOR'ed) at 510 with the n bits 542 stored in servo type SR 507. In the event of a missed servo type, servo type missed flag 530 is clocked into erasure SR 508, marking the position of the erasure relative to the servo sector types in servo type SR 507. The complemented output 539 of erasure SR 508 is then AND'ed 511 with XOR outputs 549. AND output 550 is input to filter 512, along with erasure count 541. Filter 512 compares erasure count 541 to the value e stored in the code power register 502. Pattern evaluation proceeds if the erasure count 541 is>e. Filter 512 then performs the pattern evaluation using the code properties 548 d and t stored in the code power register 502. An SSN found indication 554 occurs if the number of bits in error are determined to be correctable. This occurs when the number of 1's at 550 (D) is$\leq$s, where s=(d−1−e−t)/2. Filter 512 thus measures the Hamming distance between the received pattern 542 and the segment of the rotated track pattern 547, without counting the erasure locations.

The SSN found signal 554 is passed to qualifier 513, and also resets clock enable 503, halting the comparison process. Filter 512 also produces outputs 553 (number of errors corrected), 552 (SSN not found), and 551 (number of errors detected when SSN not found). Qualifier 513 reports the results of the search to controller electronics 115 (FIG. 4). SSN found 555 indicates that a SSN was successfully found. The shift modulo count output 561 passed to the qualifier 513 is then output as the servo sector number 556. The number of corrected errors 553 is then output as the number of total errors 557. However, if the number of errors detected by filter 512 exceeds t, then a SSN not found signal 552 is generated and is used to reset clock enable 503 to halt further searching. This step is optional, but may be preferred for robustness, since it will help prevent the misidentification of a SSN. However, in most cases, it is expected that the SSN outputs are sequential from one servo sector to the next, and this information can be used to determine if an SSN has been misidentified. When the SSN is missed in this manner, then the number of errors detected 551 is output as the total errors 557. When the SSN is found or missed, the erasure count 509 is output as erasure count 560. Finally, if the search counter 505 reaches 0 without a SSN being found, SSN missed signal 559 is input to qualifier 513, and resets clock enable 503, halting the search process. Qualifier 513 passes the SSN missed condition to the control electronics 115 via 558.

Note that the erasure count 509 allows for the SSN decode process to begin once n−e servo types have been found following initialization. Also, the circuits described here are well suited for quick SSN determination. Upon initialization, it may take up to m clocks to find index. However, once an SSN is found, this design will automatically be set to the next likely SSN pattern. Some operations, such as a head switch, may benefit from quicker SSN identification by adjusting the shift modulo count forward or backward to account for any anticipated SSN skew.

Search counter 505 is provided to terminate the search operation after all track pattern rotations have been tested. If counter 505 counts down to zero prior to an SSN pattern match occurring, then it signals SSN missed 559. Search counter 505 is reset to m by 544, which is the OR of SSN missed 559, SSN found 554 and SSN not found 552. 544 also shuts off clock enable 503, halting the comparison process. Qualifier 513 will output servo sector number missed 558 to indicate the condition.

This circuitry has been described for the case of isolated bit errors. However, it may be adapted to address the case of burst or other types of errors by appropriately modifying the filter 512. This circuitry has been described for the case of 2 servo types, but the modifications for handling more servo types are straightforward. Further, it is straighfforward to replace some or all of the circuits described here with software. SSN decoding may be well suited to a software approach since a short delay following the servo sector may be acceptable for SSN determination.

While the above description involves the decoding of the SSN from servo sector types in a data recording disk drive, the invention is more broadly applicable to a wide range of systems for determining data packet identification numbers in a sequence of data packets in a cyclic manner. For example, in an optical or magnetic recording disk or tape drive that uses header fields in the recording media, the user data sectors may be thought of as the data packets. The data sector number may be encoded as described above, using data sector types instead of servo sector types. In another example, a data stream may be comprised of a set of data packets transmitted in sequence. A packet type value may be encoded in each packet, and the sequence of packet numbers determined using a code like the SSN code described above. The packet number may then be determined from a sequential set of packets, even in the presence of errors in the packet types. Alternately, the error detection properties may be used to detect incorrect sequences of packets, which is useful for detecting tampering with the data stream.

The above description has been primarily concerned with detecting and correcting errors in the sequence type values. However, codes with d=1, where no detection or correction are possible, can be useful when the error rate of the servo types is low. Such situations are likely in communication networks. Further, once a sequence number has been determined, the subsequent sequence numbers should follow in order. Errors may be detected by examining the order of the sequence numbers.

Further, the embodiments described above have covered the situation where the sequence numbers occur in a cyclic fashion. However, the invention is equally applicable to non-cyclic sequence numbering. Non-cyclic codes may be generated by omitting the wrap around condition. Non-cyclic codes may be decoded by simple modifications of the circuit of FIG. 6. It is beneficial to retain the cyclic register and control functions, since they are useful to initializing the search. Care must be taken not to compare against wrapped locations. Codes of any finite length may thus be generated and decoded.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A data recording disk drive that has a recording disk and a transducer that reads information from or writes information to the disk, the disk drive comprising:

a disk having a plurality of generally circular tracks, each of the plurality of tracks having a plurality of data sectors for user data and m angularly spaced servo sectors containing transducer positioning servo information, each of the m servo sectors being one of a plurality of p unique servo types, where p is less than m;

a motor for rotating the disk;

a transducer which reads information in the servo sectors, including information representing the servo types, and reads or writes user data in the data sectors;

a servo type identifier for identifying, from the servo type, each of the m servo sectors as being one of the p servo types; and a servo sector number decoder for determining the servo sector number when a pattern of n sequential identified servo types corresponds to one of m unique predetermined patterns representative of m servo sector numbers, wherein each of the m servo sector number patterns of n bits has a sliding distance d to every other of the m servo sector number patterns, where the sliding distance d determines the error correction capability, and wherein the servo sector number decoder includes means for correctly identifying each of the m servo sector number patterns in the presence of up to s errors and up to e erasures in the n sequential identified servo types, and means for detecting up to s+t errors provided that more than s errors have occurred and that 2s+t+e<d.

2. The disk drive according to claim 1 wherein p is two.

3. The disk drive according to claim 1 wherein the servo sector number decoder includes a shift register for converting serial bits representing a sequence of identified servo types into n parallel bits, storage means for storing fixed bit patterns corresponding to the m servo sector number patterns, means for determining the exclusive OR of the output of the shift register with the fixed servo sector number bit patterns, and means for generating a servo sector found signal when the number of ones in the exclusive OR'ed output is less than or equal to s.

4. The disk drive according to claim 1 wherein the servo sector number decoder includes means for detecting an uncorrectable error when the number of errors is greater than s but less than or equal to s+t.

5. The disk drive according to claim 1 wherein the sliding distance d determines the correction of burst errors, and wherein the servo sector number decoder includes means for correctly identifying each of the m servo sector number patterns in the presence of up to s burst errors and up to e burst erasures in the n sequential identified servo types, and means for detecting up to s+t burst errors provided that more than s burst errors have occurred and that 2s+t+e<d.

6. The disk drive according to claim 1 wherein one of the decoded servo sector numbers represents the start of the track.

7. The disk drive according to claim 1 wherein each of the servo sectors includes a servo timing mark (STM) and wherein the servo types are encoded within the STMs.

8. The disk drive according to claim 1 wherein each of the servo sectors includes a track identification (TID) field and wherein the servo types are encoded within the TID field.

9. The disk drive according to claim 1 wherein each of the servo sectors includes a position error signal (PES) field and wherein the servo type values are encoded within the PES field.

10. A data recording disk for use in a disk drive having a recording transducer for reading or writing data to the disk, the disk having a plurality of generally circular tracks, each of the plurality of tracks having a plurality of data sectors for user data and m angularly spaced servo sectors containing transducer positioning servo information, each of the m servo sectors being one of a plurality of p unique servo types, where p is less than m, wherein sequences of sector types from sets of n angularly adjacent servo sectors form m patterns that uniquely identify the m servo sectors on the track, and wherein each of the m servo sector number patterns of n bits has a sliding distance d to every other of the m servo sector number patterns, where the sliding distance d determines the error correction capability.

11. The data recording disk of claim 10 wherein p is two.

12. The disk according to claim 10 wherein the servo information in each of the servo sectors includes a servo timing mark (STM), and wherein there are p types of STMs representative of the p unique servo types.

13. The disk according to claim 10 wherein the servo information in each of the servo sectors includes a track identification (TID) field containing a value representative of a servo type.

14. The disk according to claim 10 wherein the servo information in each of the servo sectors includes a position error signal (PES) field containing a value representative of a servo type.

15. Data recording media having a plurality of data tracks, each of the plurality of tracks having m data sectors for user data, each of the m data sectors containing a value representative of one of a plurality of p unique data sector types, where p is less than m, wherein sequences of data sector type values from sets of n adjacent data sectors form m patterns of n-bits each that uniquely identify the m data sectors on the track, and wherein each of the m data sector patterns of n bits has a sliding distance d to every other of the m data sector patterns, where the sliding distance d determines the error correction capability.

* * * * *